(12) United States Patent
Kim

(10) Patent No.: US 8,197,275 B2
(45) Date of Patent: Jun. 12, 2012

(54) METHOD FOR MANUFACTURING SEMICONDUCTOR DEVICE

(75) Inventor: Jung Nam Kim, Seoul (KR)

(73) Assignee: Hynix Semiconductor Inc, Icheon (KR)

( * ) Notice: Subject to any disclaimer, the term of this patent is extended or adjusted under 35 U.S.C. 154(b) by 0 days.

(21) Appl. No.: 12/843,461

(22) Filed: Jul. 26, 2010

(65) Prior Publication Data

US 2011/0159679 A1   Jun. 30, 2011

(30) Foreign Application Priority Data

Dec. 29, 2009   (KR) .................. 10-2009-0132510

(51) Int. Cl.
*H01L 21/00* (2006.01)
(52) U.S. Cl. ...................... 439/243; 438/589
(58) Field of Classification Search .......... 438/243–249, 438/589
See application file for complete search history.

(56) References Cited

U.S. PATENT DOCUMENTS 5,180,680 A * 1/1993 Yang .............................. 438/259
5,840,601 A * 11/1998 Cho .............................. 438/151

FOREIGN PATENT DOCUMENTS

KR   1020100080689 A   7/2010
KR   1020100130698 A   12/2010

* cited by examiner

*Primary Examiner* — Richard A. Booth

(57) ABSTRACT

A method for manufacturing a semiconductor device is provided. A semiconductor substrate is etched to form a trench, a gate electrode is buried in the trench, an etch-back process thereon is performed to form a buried gate, and an insulating layer is formed at the entire surface with the trench. Subsequently, an ion implantation process with respect to the entire surface with the insulting layer is carried out, the dose amount in ion-implanted in the insulating layer of an upper portion of the semiconductor substrate is more than that of a sidewall in the trench. Therefore, when an etch process is performed to form a contact during a subsequent procedure, the short between the buried gate and the contact may be prevented using a difference between an etch rate of the insulating layer.

11 Claims, 3 Drawing Sheets

METHOD FOR MANUFACTURING SEMICONDUCTOR DEVICE

CROSS-REFERENCES TO RELATED APPLICATIONS

Priority to Korean patent application number 10-2009-0132510, filed on Dec. 29, 2009, which is incorporated by reference in its entirety, is claimed.

BACKGROUND OF THE INVENTION

The present invention relates to a method for manufacturing a semiconductor device.

A typical semiconductor memory device is constructed of a plurality of unit cells, each including one capacitor and one transistor. The capacitor is used to temporarily store data. The transistor is used to transfer data between a bit line and the capacitor according to a control signal. The transistor uses the characteristics of a semiconductor to change an electric conductivity according to an environment. The transistor is composed of three regions including a gate, a source, and a drain. Charge transfer occurs between the source and the drain according to a control signal input to the gate. The charge transfer between the source and the drain is achieved through a channel region using the characteristics of the semiconductor.

After a transistor gate is formed on a semiconductor substrate, impurities are doped in both sides of the gate to form a source and a drain. As a data storage capacity of the semiconductor memory device is increased and the semiconductor memory device becomes highly integrated, there is a need to reduce the unit cell size. Namely, since a design rule of the capacitor and the transistor included in the unit cell is decreased, and accordingly a channel length of a cell transistor is gradually reduced, a short channel effect and Drain Induced Barrier Lower (DIBL) occurs in a transistor deteriorates an operation reliability. Phenomena occurring due to a reduction in channel length can be solved upon maintaining a threshold voltage so that the cell transistor may perform a normal operation. In general, the shorter the transistor channel length, the larger the doping density needed in a channel formation region.

However, when the design rule is reduced to less than 100 nm, a doping density of impurities in a channel formation region is increased accordingly. This increases an electric field in a storage node (SN) junction to thereby deteriorate a refresh characteristic of the semiconductor memory device. To solve the problem, a cell transistor having 3 dimensional channel structure is used in which a channel is also formed in a vertical direction so that a channel length of a transistor can be maintained in spite of a reduction in the design rule. Namely, although a channel width in a vertical direction is short, the doping density can be reduced so long as a channel length in the vertical direction is secured, thereby preventing the refresh characteristic from being deteriorated.

In addition, the higher integration of a semiconductor device, the shorter a distance between a word line and a bit line connected to a cell transistor. Due to this, parasitic capacitance is increased to impose a limitation on an operation margin of a sense amplifier amplifying data transferred through the bit line. This deteriorates operation reliability of a semiconductor device. To solve such a problem, a buried word line structure has been proposed to reduce parasitic capacitance between a bit line and a word line. In this case, in the buried word line structure, the word line is formed only in a recess and not on an upper portion of a semiconductor substrate. In the buried word line structure, a conductive material is formed in the recess formed in the semiconductor substrate, and an upper portion of the conductive material is covered with an insulating layer to bury the word line in the semiconductor substrate. Accordingly, an electric isolation with the bit line or a contact on the semiconductor substrate on which source/drain are disposed can be clearly achieved.

As described above, after a buried word line (buried gate), a is capping insulating layer is formed to protect an electrode gate. However, in order to form a contact during a subsequent procedure, the capping insulating layer is significantly etched by mis-alignment or over-etching during an etch process to cause a short to occur between the buried word line and the contact.

BRIEF SUMMARY OF THE INVENTION

Embodiments of the present invention are directed to a method for manufacturing a semiconductor device.

According to an embodiment of the present invention, a method for manufacturing a semiconductor device includes: forming a trench on a semiconductor substrate; burying a gate electrode in the trench to form a buried gate; depositing a first insulating layer at an entire surface with the buried gate; implanting ions into the entire surface with the first insulating layer; forming a second insulating layer at the entire surface with the first insulating layer in which the ions are implanted; and etching the second insulating layer, the first insulating layer, and the semiconductor substrate to form a contact. The first and second insulating layers are formed of a capping oxide layer.

In accordance with an embodiment of the present invention, a method for manufacturing a semiconductor device further includes forming a hard mask layer between the semiconductor substrate and the first insulating layer. The hard mask layer is an oxide layer or a nitride layer. The gate electrode is formed of titanium nitride (TiN) or by stacking the titanium nitride (TiN) and tungsten (W).

In accordance with an embodiment of the present invention, after forming a trench, a method for manufacturing a semiconductor device further includes depositing a gate oxide layer. In implanting ions, a dose amount to be ion-implanted into the first insulating layer of the upper portion of the semiconductor substrate is more than a dose amount to be ion-implanted into the first insulating layer of the sidewall in the trench. In implanting ions, an ion source uses argon (Ar) or nitrogen ($N_2$).

DESCRIPTION OF EMBODIMENTS

Embodiments of the present invention are described with reference to the accompanying drawings in detail.

FIG. 1a to FIG. 1e are cross-sectional views illustrating a method for manufacturing a semiconductor device according to an embodiment of the present invention.

Figure 1A:
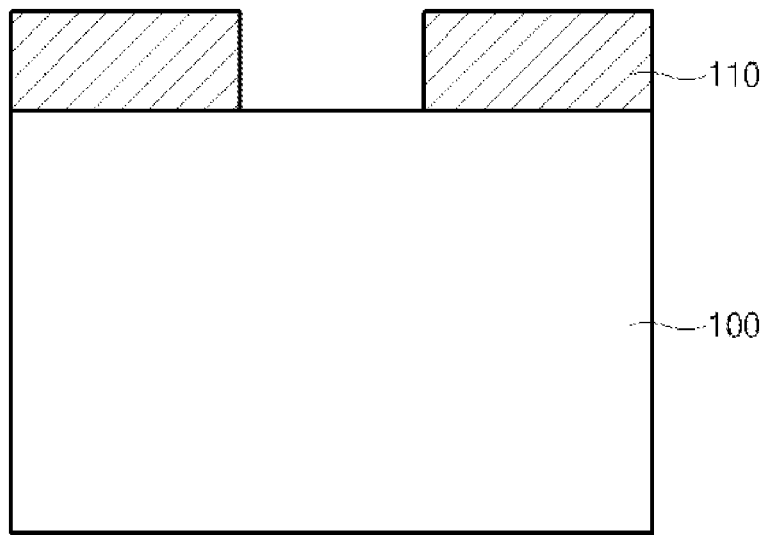
FIG. 1a to FIG. 1e are cross-sectional views illustrating a method for manufacturing a semiconductor device according to an embodiment of the present invention.

Referring to FIG. 1a, a hard mask layer (not shown) is formed on a semiconductor substrate 100. At this time, the hard mask layer is preferably an oxide layer or a nitride layer.

Next, after formation of the hard mask layer, a photo resist pattern (not shown) is formed by exposure and development processes. The hard mask layer is etched by using the photo resist pattern as a mask to form a hard mask layer pattern 110.

Figure 1B:
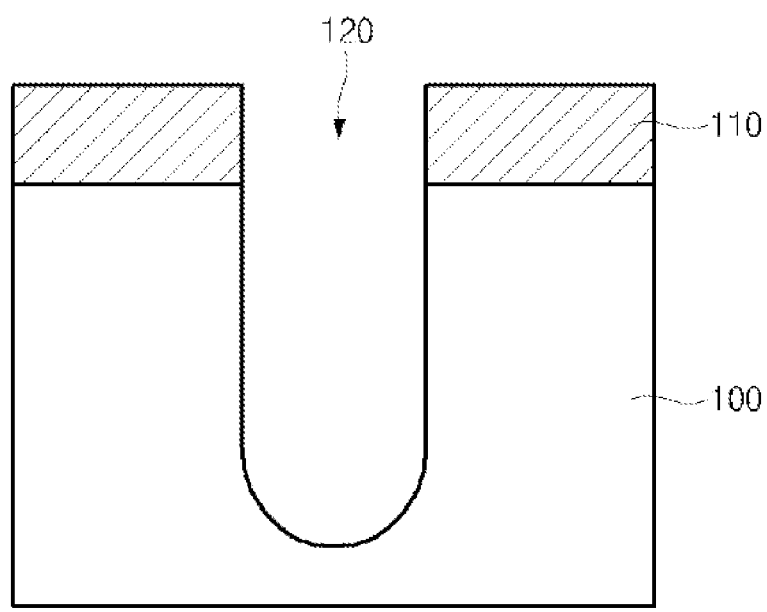

Referring to FIG. 1b, a lower semiconductor substrate 100 is etched by using the hard mask pattern as an etch mask to form a trench 120. In this case, it is preferred that the trench becomes a region for forming a buried gate during a subsequent procedure.

Figure 1C:
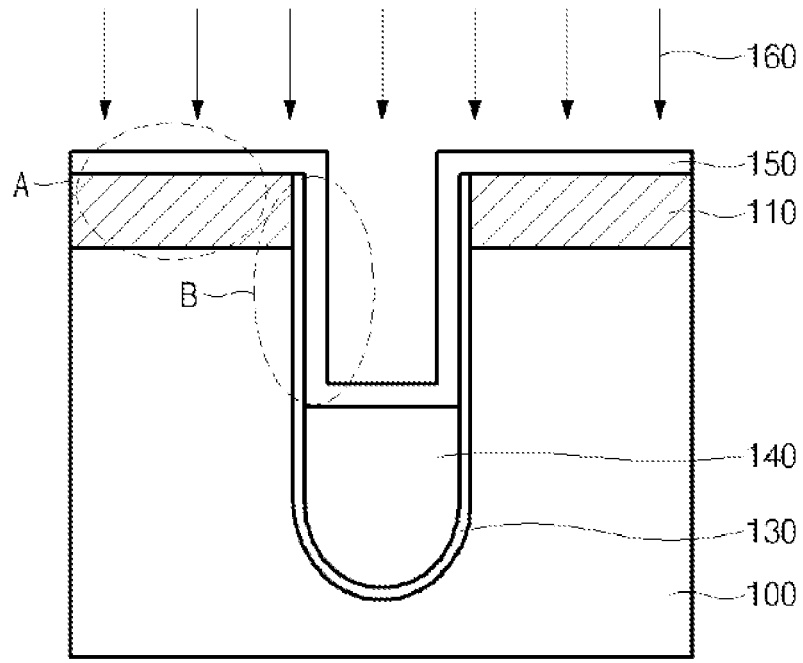

Referring to FIG. 1c, after executing gate oxidation on the entire surface, it is etched-back to form a gate oxide layer 130 in the trench.

Then, a gate electrode is deposited on the entire surface including the gate oxide layer 130. At this time, the gate electrode is preferably formed by stacking titanium nitride (TiN) and tungsten (W). Hereinafter, a gate electrode layer is etched-back to form a buried gate 140 in the trench 120.

Next, a first capping insulating layer 150 is formed on the entire surface including the buried gate 140. At this time, the first capping insulating layer 150 is preferably formed with an oxide layer.

Then, ions are implanted into the entire surface of the first capping insulating layer 150 using an ion implantation procedure (160). During the ion implantation procedure (160), ions of argon (Ar) or nitrogen ($N_2$) are preferably implanted.

Here, as a result of the ion implantation procedure 160, a relatively large amount of ions are implanted into the first capping insulating layer 150 formed over an upper portion (region A) of the semiconductor substrate 100. In comparison, a relatively little amount of ions are implanted into the first capping insulating layer 150 formed over a sidewall (region B) in the trench 120. The difference in impurity concentration causes the difference in etch rate during formation of a contact during a subsequent procedure. Since a bonding force of the first capping insulating layer 150 formed in the region A is weakened due to the ion implantation, the first capping insulating layer 150 formed in region A is more easily etched than the first capping insulating layer 150 formed over the sidewall that has less impurity concentration.

Since the first capping insulating layer 150 formed on the sidewall (region B) of the trench 120 is less concentration of impurities than the first capping insulating layer 150 formed over the region A, the bonding force of the former is stronger than the latter. Thus, the region B shows a lower etching selectivity compared to the region A. As a result, during formation of a contact, when a defect such as a misalignment occurs, an electrical short can be prevented between the buried gate and the contact.

Figure 1D:
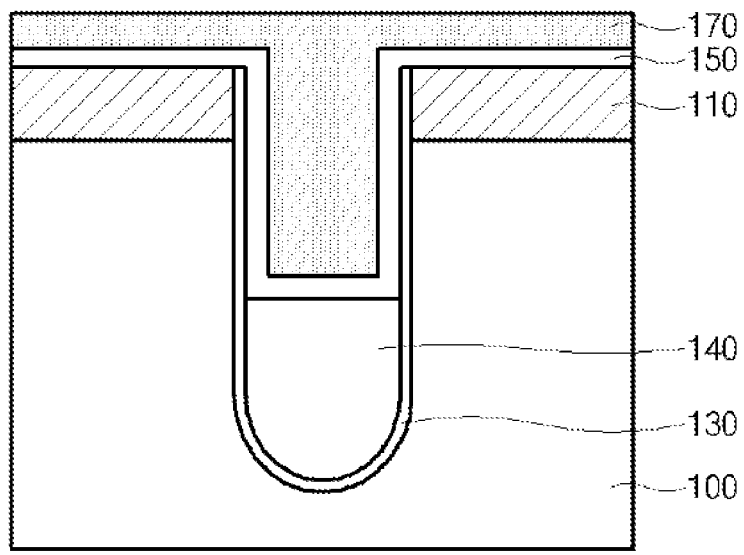
Figure 1E:
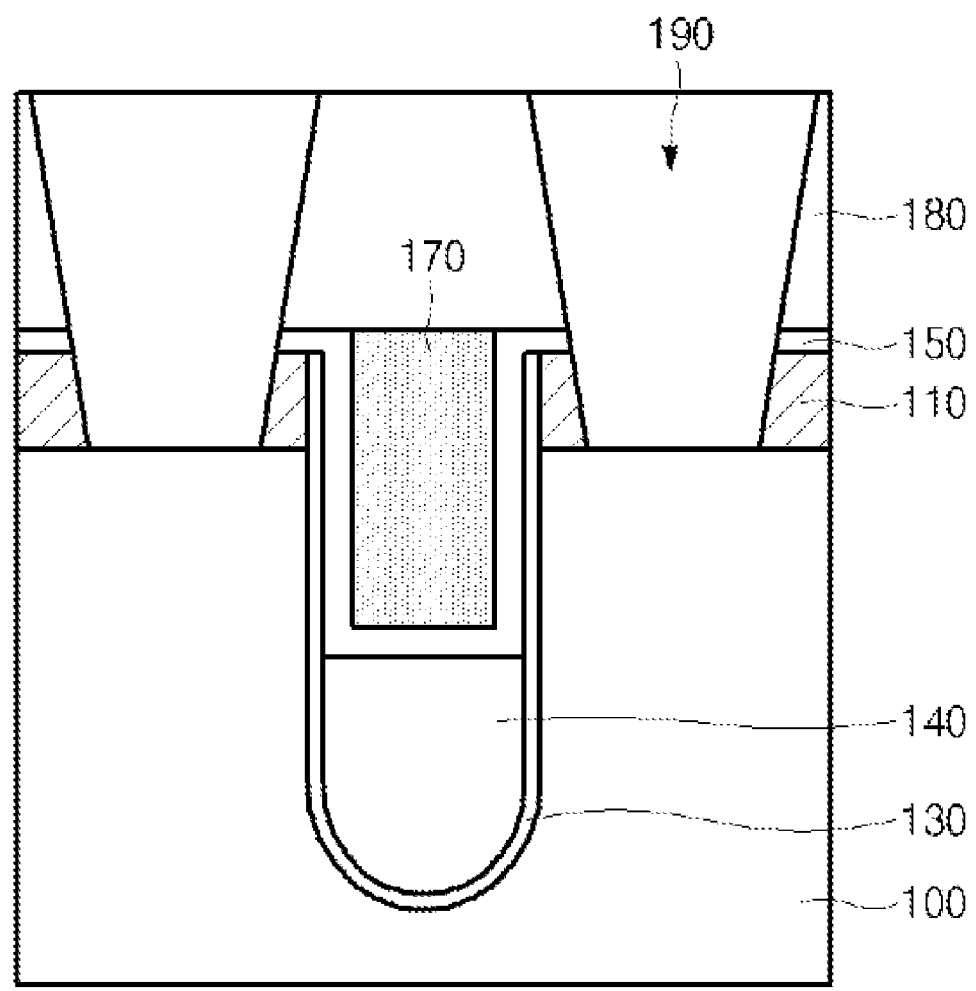

Referring to FIG. 1d and FIG. 1e, after the ion implantation, a second capping insulating layer 170 and an interlayer dielectric layer 180 are formed on the entire surface with the first capping insulating layer 150.

After forming a photoresist on the interlayer dielectric layer 180, a photoresist pattern (not shown) is formed by an exposure and development process. After etching the interlayer dielectric layer 180 by using the photo resist pattern as a mask, a conductive material is buried to form a contact plug 190.

As apparent from the above description, in an embodiment of the present invention, the semiconductor substrate is etched to form the trench, a gate electrode is buried in the trench, an etch-back process thereon is performed to form a buried gate, and an insulating layer is formed on the entire surface including the trench. Subsequently, an ion implantation process with respect to the entire surface with the insulting layer is carried out, the dose amount in ions implanted in the upper portion of the insulating layer of the semiconductor substrate is more than in the sidewall in the trench.

Therefore, when an etch process is performed to form a contact during a subsequent procedure, an electrical short between the buried gate and the contact may be prevented using a difference between an etch rate of the regions A and B of the insulating layer.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, comprising:
    forming a trench on a substrate;
    forming a conductive material in a low portion of the trench, the conductive material defining a buried gate;
    depositing a first insulating layer over the substrate and over a sidewall of the trench;
    implanting ions into the first insulating layer in order to change an etch characteristic of the first insulating layer, wherein the ion includes argon (Ar) or nitrogen (N2);
    forming a second insulating layer at the entire surface including the first insulating layer; and
    etching the second insulating layer and the first insulating layer to form a contact hole exposing the substrate.

2. The method of claim 1, wherein the first and second insulating layers each includes an oxide layer.

3. The method of claim 1, further comprising forming a hard mask layer between the substrate and the first insulating layer, wherein the hard mask layer is etched to form a contact plug so that the contact plug contacts the substrate.

4. The method of claim 3, wherein the hard mask layer is an oxide layer or a nitride layer.

5. The method of claim 1, wherein the conductive material includes tungsten (W), titanium (Ti), titanium nitride (TiN) or tungsten nitride (WN).

6. The method of claim 1, after forming a trench, further comprising depositing a gate oxide layer over the trench.

7. The method of claim 1, wherein, in implanting ions, a dose amount to be ion-implanted into the first insulating layer of the upper portion of the semiconductor substrate is more than a dose amount to be ion-implanted into the first insulating layer of the sidewall in the trench.

8. A method for manufacturing a semiconductor device, comprising:
    forming a trench in a substrate;
    forming a gate electrode in a lower portion of the trench;
    forming a first insulating layer over the substrate and over a sidewall of the trench;
    implanting ions into a first portion of the first insulating layer overlying the substrate and a second portion of the first insulating layer overlying the sidewall of the trench, wherein the ion includes argon (Ar) or nitrogen (N2);
    forming a second insulating layer over the first and second portions of the first insulating layer and into an upper portion of the trench; and
    etching the second insulating layer overlying the first portion of the first insulating layer and the first portion of the first insulating layer to form a contact hole exposing the substrate.

9. The method of claim 8, wherein the first portion of the first insulating layer has a different etching selectivity from the second portion of the first insulating layer.

10. The method of claim 8, wherein the first portion of the first insulating layer has a higher impurity concentration than that of the second portion of the first insulating layer.

11. The method of claim 8, the method further comprising:
forming a hard mask layer between the substrate and the first insulating layer, wherein the hard mask layer is etched to form the contact hole, and
forming a contact plug in the contact hole so that the contact plug coupled to the substrate.

* * * * *